United States Patent
Asis et al.

(10) Patent No.: US 9,307,665 B2
(45) Date of Patent: Apr. 5, 2016

(54) ELECTRICAL COMPONENT PACKAGING

(71) Applicant: NXP B.V., Eindhoven (NL)

(72) Inventors: Michael Asis, Nijmegen (NL); Albertus Reijs, Eindhoven (NL); Tennyson Nguty, Newcastle (GB); An Xiao, Den Bosch (NL)

(73) Assignee: SAMBA HOLDCO NETHERLANDS B.V., Eindhoven (NL)

(*) Notice: Subject to any disclaimer, the term of this patent is extended or adjusted under 35 U.S.C. 154(b) by 15 days.

(21) Appl. No.: 14/257,768

(22) Filed: Apr. 21, 2014

(65) Prior Publication Data
US 2014/0318854 A1    Oct. 30, 2014

(30) Foreign Application Priority Data
Apr. 24, 2013 (EP) .................................... 13165213

(51) Int. Cl.
*H01L 23/02* (2006.01)
*H05K 7/02* (2006.01)
*H01L 23/057* (2006.01)
*H01L 23/495* (2006.01)
*H01L 23/10* (2006.01)

(52) U.S. Cl.
CPC ............... *H05K 7/02* (2013.01); *H01L 23/057* (2013.01); *H01L 23/10* (2013.01); *H01L 23/49541* (2013.01); *H01L 2224/48091* (2013.01); *H01L 2224/48247* (2013.01); *H01L 2924/16152* (2013.01)

(58) Field of Classification Search
CPC .. H01L 23/4951; H01L 23/057; H01L 23/104

USPC .......................................................... 174/538
See application file for complete search history.

(56) References Cited

U.S. PATENT DOCUMENTS

| | | | |
|---|---|---|---|
| 3,482,419 A | 12/1969 | Rogers et al. | |
| 4,706,105 A | 11/1987 | Masuda et al. | |
| 4,952,531 A | 8/1990 | Cherukuri | |
| 5,155,299 A | 10/1992 | Mahulikar et al. | |
| 6,013,946 A | 1/2000 | Lee et al. | |
| 7,598,119 B2 | 10/2009 | Martinez et al. | |
| 2009/0194859 A1* | 8/2009 | Kang et al. | 257/676 |
| 2012/0001309 A1 | 1/2012 | Soyano | |
| 2012/0326289 A1 | 12/2012 | Minanio | |

FOREIGN PATENT DOCUMENTS

| | | |
|---|---|---|
| EP | 0 788 157 A2 | 8/1997 |
| JP | 61 242053 A | 10/1986 |
| WO | 2007/050287 A2 | 5/2007 |

OTHER PUBLICATIONS

Extended European Search Report for EP Patent Appln. No. 13165213.3 (Sep. 24, 2013).

* cited by examiner

*Primary Examiner* — Hung V Ngo
(74) *Attorney, Agent, or Firm* — McDonnell Boehnen Hulbert & Berghoff LLP

(57) ABSTRACT

The invention provides an air cavity package for a component. The package has a connection lead structure in which the or each connection lead has a connection zone within the package for receiving a wire connector. A region of no connection lead material is provided directly between the connection zone and the neighboring outer edge of the cavity. This provides a trap for flowing interconnect material.

7 Claims, 5 Drawing Sheets

ELECTRICAL COMPONENT PACKAGING

CROSS-REFERENCE TO RELATED APPLICATIONS

This application claims the priority under 35 U.S.C. §119 of European patent application no. 13165213.3, filed on Apr. 24, 2013, the contents of which are incorporated by reference herein.

This invention relates to electrical component packaging, in particular air cavity packages used for housing integrated circuits or components.

In RF power applications, power amplifier products are often packaged in air cavity packages. Air cavity packages are typically built-up by a stack of different materials, for example a heat sink layer, dielectric ring, interconnect layers, leads and lid. The package encapsulates semiconductor dies, internal wiring and an air cavity.

FIG. 1 shows a typical air cavity package. The base of the structure comprises a heat sink 10, on which are provided interconnect layers 12 and a dielectric ring 14. The ring surrounds an internal cavity. The leads of the lead frame 16 provide interconnections between the exterior of the cavity to the interior, and a lid 18 seals the cavity.

When attaching the leads onto the dielectric ring 14, the leads are all connected in one frame. The leads are separated from the connecting frame directly after attaching the leadframe onto the dielectric ring or later in the product assembly process after assembling the complete product including dies, wires and lid.

An interface layer is between the lid 18 and the leadframe 16 and this is typically an epoxy resin layer for bonding the lid. The lid and dielectric ring are typically made from similar ceramic material.

These air cavity packages are subjected to high thermo-mechanical stress brought about by the thermal excursion during soldering of the package in application. The high stress is normally concentrated at the corners of the package which can later cause delamination of the weakest interface resulting to gross leak failures and damaging the wires which in the end results in a non-functional device.

One particular problem is flowing of the resin interface layer.

According to the invention there are provided an apparatus and method as defined in the claims.

In one aspect, the invention provides an air cavity package for an electrical component, wherein the package comprises a base, a first set of layers forming an enclosure, a connection lead structure formed over the first set of layers for connecting to the component within the package and having connection terminals outside the package, a bond layer over the connection lead structure and a lid over the bond layer, wherein the inner surface of the lid defines the limit of air cavity, wherein the connection lead structure comprises at least one connection lead having a connection zone within the package for receiving a wire connector, wherein a region of no connection lead material is provided directly between the connection zone and the neighbouring outer edge of the air cavity defined by the lid.

This region of no connection lead structure can be a slot or dam feature within the lead, and is used to improve interface adhesion by introducing a locking mechanism and to prevent the adhesive from reaching the wire connectors. In particular, the region of no connection lead material is positioned so that the bond layer can flow into the region, and thereby perform an interlocking function.

The region of no connection lead material can be strategically placed so that it will not impact the RF performance of the device.

The connection lead can comprise a leg region beneath the lid and to the inside of the cavity, which leg region runs parallel to the local direction of the periphery of the lid. This leg region thus is the interface between the external terminal and the internal connection zone.

In a first example, the leg region comprises an open slot running parallel to the local direction of the periphery of the lid, with the connection zone to the side of the slot facing into the cavity. This provides a connection zone spaced from the nearest part of the edge of the cavity by a slot. The slot is inside the cavity, and thereby can catch the bond layer material running down the inside of the cavity wall (defined by the lid).

In a second example, the slot is closed.

In a third example the leg region comprises the connection zone running parallel to the local direction of the periphery of the lid and a coupling part which connects between an end of the connection zone and a connection terminal outside the package. In this case, the connection zone is an isolated finger and there is no lead frame material next to that finger. The coupling part provides the coupling across the lid and it is at one end of the finger The connection zone and the coupling part can thus form an L-shaped configuration.

There can be a return portion at the other end of the connection zone to the coupling part, so that the connection zone, the coupling part and the return portion form C-shaped configuration.

The bond layer can be an epoxy resin.

The invention also provides a packaged component, comprising
  a package of the invention;
  a component in the air cavity; and
  a wire connector between the connection zone of the connection lead and the component.

Examples of the invention will now be described in detail with reference to the accompanying drawings, in which.

The invention provides an air cavity package for a component. The package has a connection lead structure in which the (or each) connection lead has a connection zone within the package for receiving a wire connector. A region of no connection lead material is provided directly between the connection zone and the neighbouring outer edge of the cavity. This provides a trap for flowing interconnect material.

Figure 1:
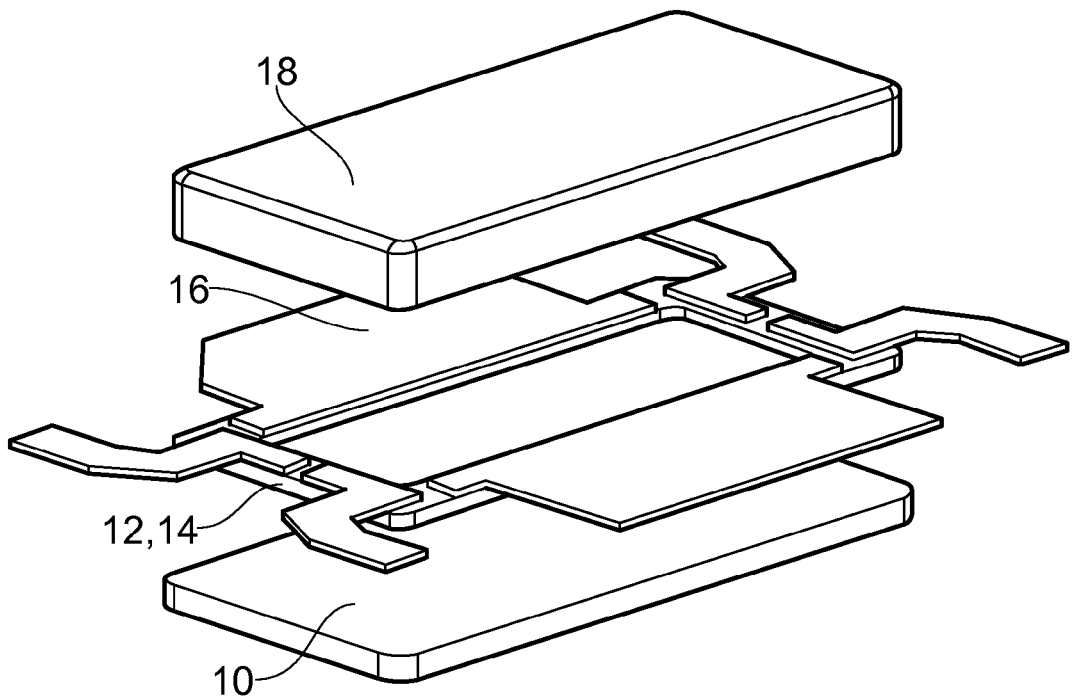
FIG. 1 shows a known air cavity package.

In the structure shown in FIG. 1, the leads have to be soldered with solder paste onto a PCB on which the package is mounted. The heat sink 10 has to be soldered by means of a solder preform or solder paste onto a cooling block which is accessible through an opening in the board.

Figure 2:
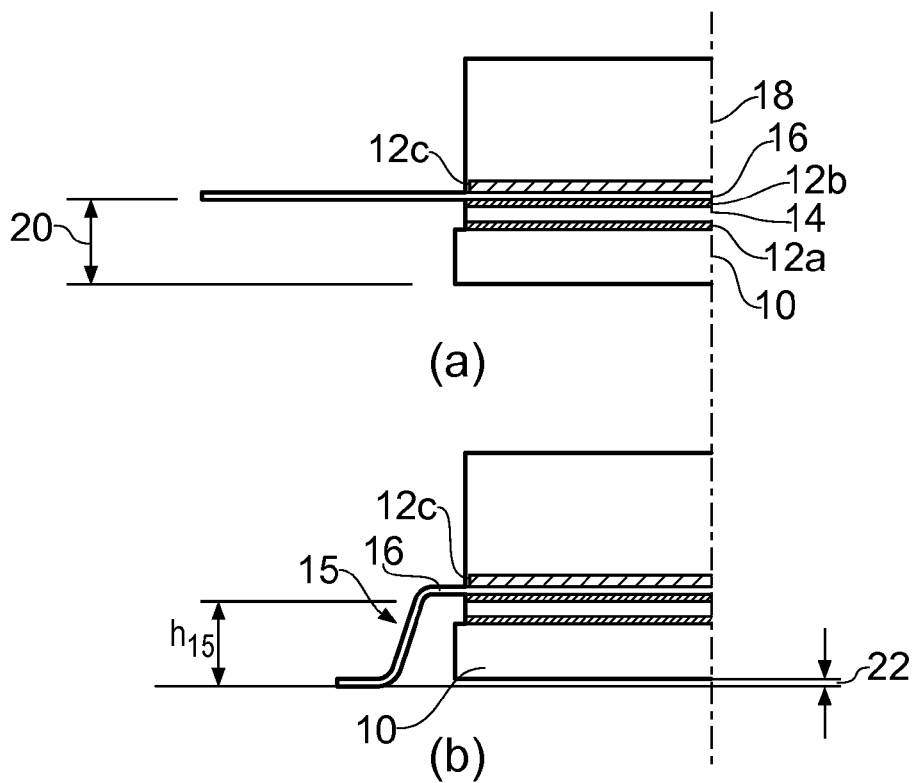
FIG. 2 shows two types of package in cross section.

FIG. 2 shows the structure in side view for two types of connection lead structure. FIG. 2(a) shows a straight lead package and FIG. 2(b) shows a gull wing lead package. In a gull wing lead package, the leads are formed with a fixed height step 15 to bring the leads of the lead frame 16 down to the base level (i.e. the base of the heat sink 10). The height of the step is shown as $h_{15}$.

Two interconnect layers 12a, 12b are shown, between which is sandwiched the dielectric ring 14. A third interconnect layer 12c is between the lid 18 and the lead frame 16.

The interconnect layers can consist of solder or adhesive. The layers 12a, 12b may not be required, in the case that the dielectric ring consists of a molding compound which in itself adheres to the heat sink 10 and leads. The invention relates in particular to problems associated with the third layer 12c, which is for bonding the lid, and which most typically comprises an epoxy resin layer. This is described as the "bond layer" below.

These air cavity packages are subjected to high thermo-mechanical stresses brought about by the thermal excursion during soldering of the package in application. The high stress is normally concentrated at the corners of the package which can later on cause delamination of the interface resulting to gross leak failures and damaged wires which in the end result in a non-functional device. The adhesion strength of the epoxy layer on the lead frame metal (typically gold) is not good enough to withstand the high stress.

Figure 3:
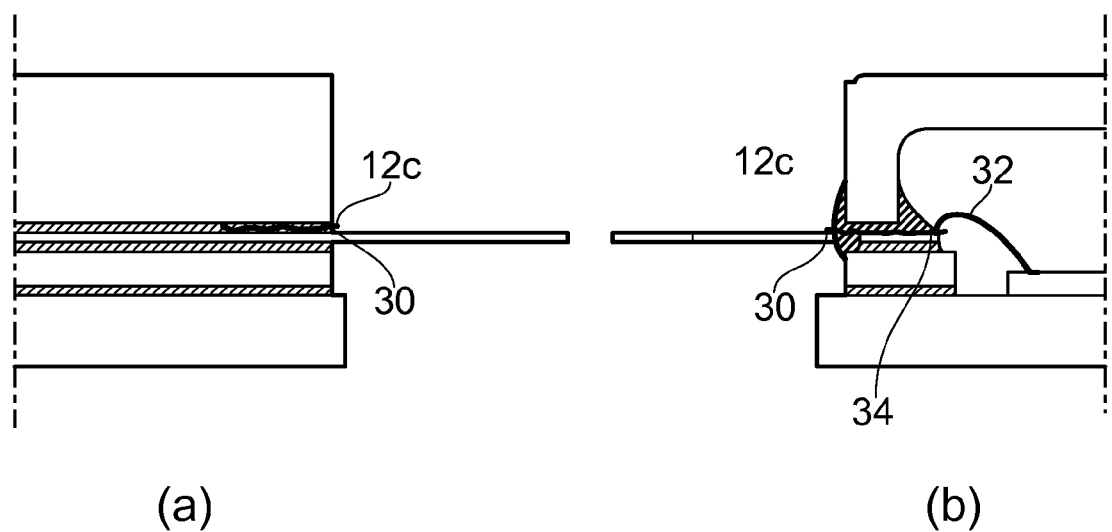
FIG. 3 shows the problem caused by damage to the resin layer which bond the lid.

The internal and external failure is shown in FIG. 3.

The problem of delamination is shown schematically as 30. The wire bond 32 which provides a connection from the lead to the internal chip can also be damaged at the location shown as 34.

FIG. 3(a) shows external epoxy delamination and FIG. 3(b) shows the external delamination reaching the bond wire 32, which is the internal electrical interconnect.

Figure 4:
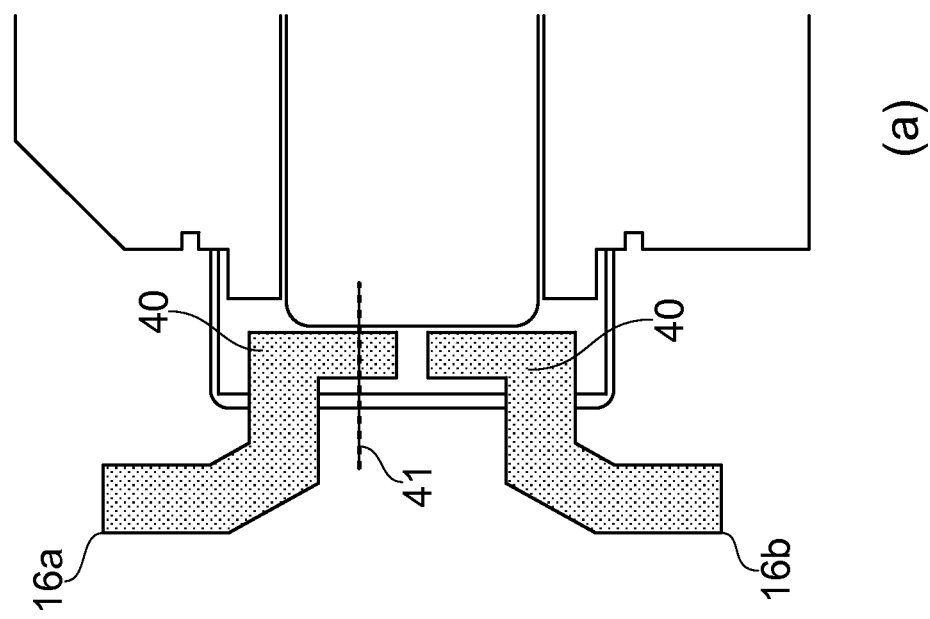
FIG. 4 shows a first known type of package and the problem addressed by the invention.
Figure 4:
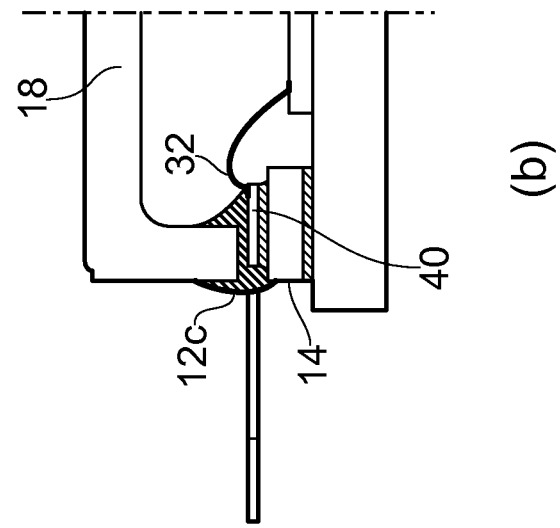

FIGS. 4(a) and 4(b) show respectively a plan view of the known package design, with the lid removed, and a cross section.

Two leads 16a, 16b are shown to which internal bond wires 32 are to be connected (as shown only in the cross section).

Each lead 16a, 16b has an external connection part and an internal leg 40. The lid 18 sits over the internal legs 40. The outside of the lid extends beyond the outer edge of these legs 40 whereas the legs extend internally into the package beyond the inside of the lid. Thus, the part of the legs inside the package provides the region for attachment of the bond wires 32, and this region can be described as a connection zone. The cross section in FIG. 4(b) is taken through the line 41, and it shows how the leg 40 is beneath the lid but also extends inwardly into the air cavity package.

In the example of FIG. 3, the bond layer 12c can flow over the top surface of the lead frame, and as shown it can reach the location where the bond wire 32 is attached. As explained above, the adhesion between the bond layer 12c (typically a resin) and the material of the lead frame 16 may not withstand processing temperatures, and also if the flow reaches the bond wire 32 as shown, this can also be damaged.

The invention provides an arrangement which reduces this problem, and also provides a lead with a connection zone within the package for receiving a wire connector. However, a region of no connection lead material is provided directly between the connection zone and the neighbouring outer edge of the cavity. This provides a trap for flowing interconnect material.

By "directly between" is meant that if a straight line is taken from the connection zone to the nearest part of the inside periphery of the lid, there will be a void along that line, such that the layer beneath the lead frame is exposed. This void acts as an interlocking feature, since it provides connection between the bond layer 12c and the dielectric layer 14 or the interface layer 12b (if there is one) on top of the dielectric layer.

Figure 5:
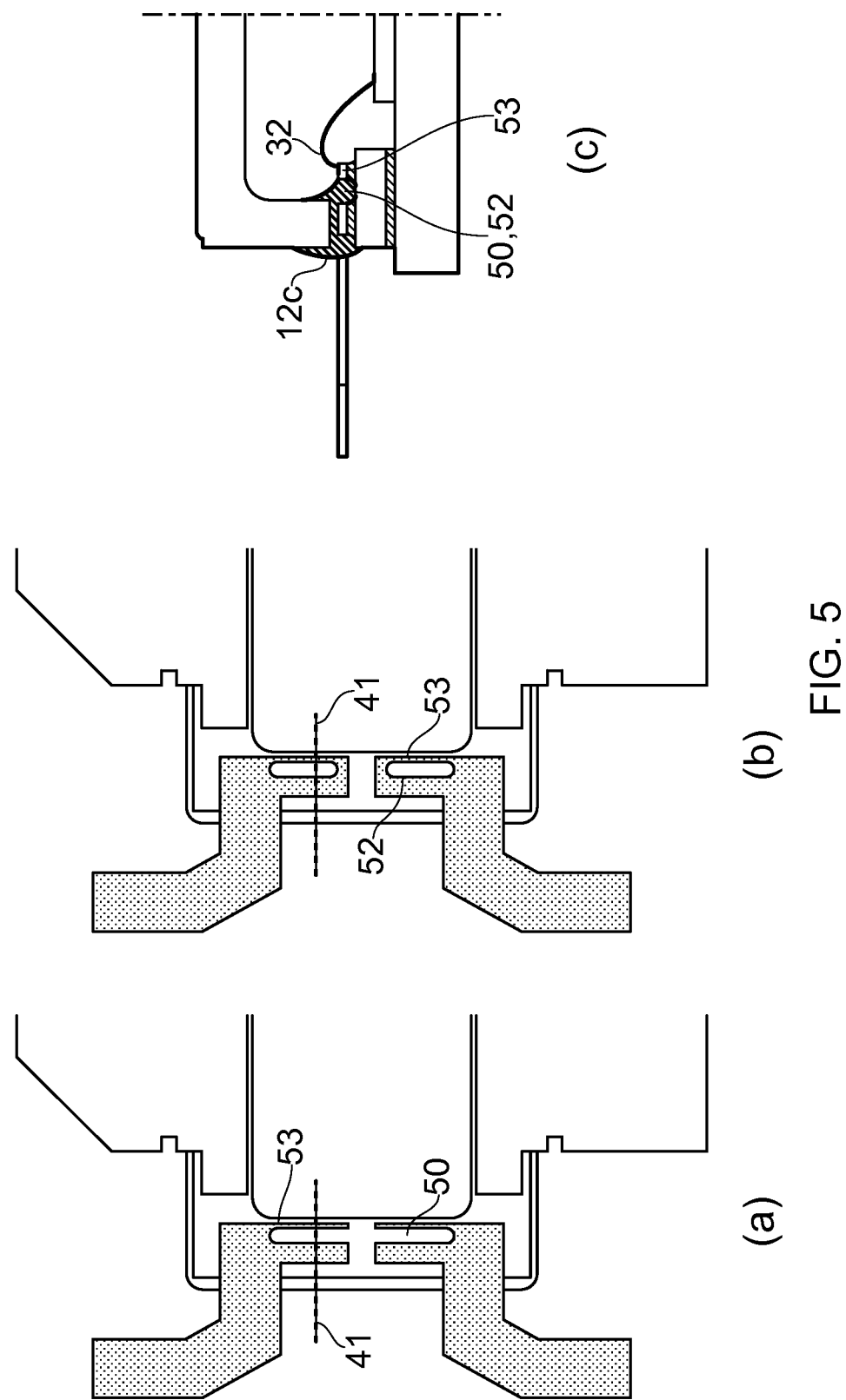
FIG. 5 shows a first two designs of package of the invention.
Figure 6:
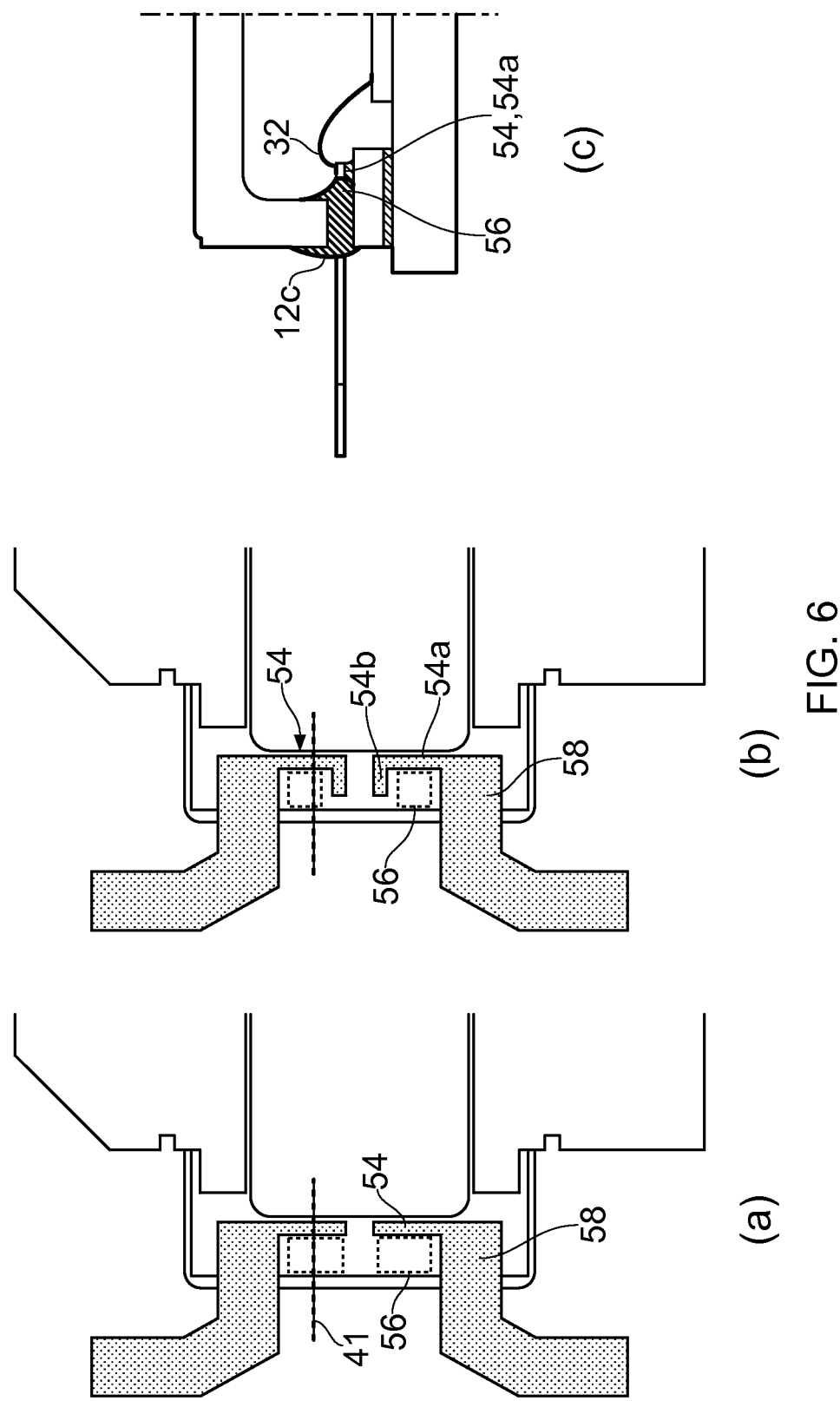
FIG. 6 shows a second two designs of package of the invention.

FIGS. 5 and 6 show four possible designs in accordance with the invention. The four designs give rise to two cross sectional views, FIG. 5(c) and FIG. 6(c) as shown.

In each case, the leg region 40 of the leads 16a, 16b has a slot or opening arrangement between the connection zone of the leg (where the leg projects furthest into the air cavity and where the wirebond connections are to be made), and the region of the lead frame which lies beneath the lid. This means that between the inner edge of lid and the wirebond connection 32 there is an opening in the lead frame.

When the bond layer 12c flows into this opening it forms an anchor, and it forms a barrier to prevent the interconnect material flowing to the wirebond contact.

The slot or opening thus provides improvement to the adhesion as well as flow control of the epoxy bond layer 12c.

The invention can be implemented by the addition of open or closed slots, or other reshaping of the leads.

FIG. 5(a) shows the leg regions provided with an open slot 50. The slot extends parallel to the lid in the region where the lid overlaps the leg portion. Thus, the slot is parallel to the length of the leg. The slot is positioned inside the cavity area as defined by the lid, so that material of the bond layer 12c at the inside of the lid can run into the slot to provide an anchor and to control the flow.

The slot has material on one side which defines the connection zone 53 for the wirebond, and material on the other side which will be under the lid.

FIG. 5(b) shows the leg regions provided with a closed slot 52. The slot is again parallel to the lid in the region where the lid overlaps the leg portion. The slot is again positioned inside the cavity area defined by the lid, so that material of the bond layer 12c at the inside of the lid can run into the slot to provide an anchor and to control the flow.

FIG. 6(a) shows the leg regions provided with a thin limb area 54 to which the wire bond is connected. The thin limb area 54 defines the connection zone and is positioned fully inside the cavity area defined by the lid, so that material of the bond layer 12c at the inside of the lid can again run to an area outside the thin limb area to provide an anchor and to control the flow. In this way, a space 56 is defined between the thin limb area 54 and the edge of the cavity.

The thin limb area thus has no material underneath the lid, but of course connection has to be made across the lid and to the external terminal. A coupling part 58 connects between an end of the thin limb area 54 and the connection terminal outside the package.

The thin limb area 54 (which defines the connection zone) and the coupling part 58 thus define an L-shaped unit.

In FIG. 6(b), the thin limb area 54 is "L" shaped, with a first portion 54a parallel to the local lid periphery (this defines the connection zone) and a second return portion 54b extending across the lid periphery direction. The second return portion 54b extends into the area beneath the lid to provide a support for the lid. The L shaped thin limb area 54a, 54b and the coupling part 58 together define a C-shaped unit.

In these designs, the slots or spaces can be strategically placed only on the leads where the high stresses are concentrated, or else all leads can be designed in this way. For example, one or two leads nearest each corner of the package can be provided with the slot or space design.

The slot design increases the surface area of the ceramic layer beneath which is exposed, and reduces the surface area of the lead frame metal (e.g. gold) which acts a locking mechanism to improve adhesion. The slot design also acts as a dam which prevents the epoxy flow from reaching the internal electrical interconnects on the leads.

In the examples above, the connection zone comprises an elongate portion of the lead which runs parallel to the local lid shape. Thus, the lead only needs to project a small way into the air cavity, leaving a large volume for the components to be housed.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An air cavity package for an electrical component, wherein the package comprises a base, a first set of layers forming an enclosure, a connection lead structure formed over the first set of layers for connecting to the component within the package and having connection terminals outside the package, a bond layer over the connection lead structure and a lid over the bond layer, wherein the inner surface of the lid defines the limit of air cavity,
   wherein the connection lead structure comprises at least one connection lead having a connection zone within the package for receiving a wire connector, wherein a region of no connection lead material is provided directly between the connection zone and the neighbouring outer edge of the air cavity defined by the lid;
   wherein the connection lead comprises a leg region beneath the lid and to the inside of the cavity, which leg region runs parallel to the local direction of the periphery of the lid;
   wherein the leg region comprises the connection zone running parallel to the local direction of the periphery of the lid and a coupling part which connects between an end of the connection zone and a connection terminal outside the package;
   wherein the connection zone and the coupling part form an L-shaped configuration;
   comprising a return portion at the other end of the connection zone to the coupling part, wherein the connection zone, the coupling part and the return portion form C-shaped configuration.

2. A package as claimed in claim 1, wherein the bond layer is an epoxy resin.

3. A packaged component, comprising a package as claimed in claim 1;
   a component in the air cavity; and
   a wire connector between the connection zone of the connection lead and the component.

4. An air cavity package for an electrical component, wherein the package comprises a base, a first set of layers forming an enclosure, a connection lead structure formed over the first set of layers for connecting to the component within the package and having connection terminals outside the package, a bond layer over the connection lead structure and a lid over the bond layer, wherein the inner surface of the lid defines the limit of air cavity,
   wherein the connection lead structure comprises at least one connection lead having a connection zone within the package for receiving a wire connector, wherein a region of no connection lead material is provided directly between the connection zone and the neighbouring outer edge of the air cavity defined by the lid;
   wherein the connection lead comprises a leg region beneath the lid and to the inside of the cavity, which leg region runs parallel to the local direction of the periphery of the lid;
   wherein at least a portion of the region of no connection lead material directly between the connection zone and the neighbouring outer edge of the air cavity defined by the lid is inside the air cavity defined by the lid such that there is an opening in the connection lead structure between the inner surface of the lid and the connection zone of the at least one connection lead;
   wherein the opening in the connection lead structure between the inner surface of the lid and the connection zone of the at least one connection lead is filled with the bond layer; and
   wherein the leg region comprises an open slot running parallel to the local direction of the periphery of the lid, with the connection zone to the side of the slot facing into the cavity.

5. An air cavity package for an electrical component, wherein the package comprises a base, a first set of layers forming an enclosure, a connection lead structure formed over the first set of layers for connecting to the component within the package and having connection terminals outside the package, a bond layer over the connection lead structure and a lid over the bond layer, wherein the inner surface of the lid defines the limit of air cavity,
   wherein the connection lead structure comprises at least one connection lead having a connection zone within the package for receiving a wire connector, wherein a region of no connection lead material is provided directly between the connection zone and the neighbouring outer edge of the air cavity defined by the lid;
   wherein the connection lead comprises a leg region beneath the lid and to the inside of the cavity, which leg region runs parallel to the local direction of the periphery of the lid;
   wherein at least a portion of the region of no connection lead material directly between the connection zone and the neighbouring outer edge of the air cavity defined by the lid is inside the air cavity defined by the lid such that there is an opening in the connection lead structure between the inner surface of the lid and the connection zone of the at least one connection lead;
   wherein the opening in the connection lead structure between the inner surface of the lid and the connection zone of the at least one connection lead is filled with the bond layer; and
   wherein the leg region comprises a closed slot running parallel to the local direction of the periphery of the lid, with the connection zone to the side of the slot facing into the cavity.

6. An air cavity package for an electrical component, wherein the package comprises a base, a first set of layers forming an enclosure, a connection lead structure formed over the first set of layers for connecting to the component within the package and having connection terminals outside the package, a bond layer over the connection lead structure and a lid over the bond layer, wherein the inner surface of the lid defines the limit of air cavity,
   wherein the connection lead structure comprises at least one connection lead having a connection zone within the package for receiving a wire connector, wherein a region of no connection lead material is provided directly between the connection zone and the neighbouring outer edge of the air cavity defined by the lid;

wherein the connection lead comprises a leg region beneath the lid and to the inside of the cavity, which leg region runs parallel to the local direction of the periphery of the lid;

wherein the leg region comprises an open slot or a closed slot running parallel to the local direction of the periphery of the lid, with the connection zone to the side of the slot facing into the cavity, wherein at least a portion of the slot is inside the air cavity defined by the lid such that there is an opening in the lead structure between the inner surface of the lid and the connection zone of the at least one connection lead.

7. A package as claimed in claim 6, wherein the opening in the connection lead structure between the inner surface of the lid and the connection zone of the at least one connection lead is filled with the bond layer.

\* \* \* \* \*